(12) United States Patent
Mos et al.

(10) Patent No.: US 7,683,351 B2
(45) Date of Patent: Mar. 23, 2010

(54) LITHOGRAPHIC APPARATUS AND DEVICE MANUFACTURING METHOD

(75) Inventors: Everhardus Cornelis Mos, Best (NL); Maurits Van Der Schaar, Eindhoven (NL); Hubertus Johannes Gertrudus Simons, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 473 days.

(21) Appl. No.: 11/607,098

(22) Filed: Dec. 1, 2006

(65) Prior Publication Data

US 2008/0128642 A1 Jun. 5, 2008

(51) Int. Cl.
G03F 7/20 (2006.01)
(52) U.S. Cl. .............................. 250/492.22; 250/491.1; 355/53
(58) Field of Classification Search ........................ None
See application file for complete search history.

(56) References Cited

U.S. PATENT DOCUMENTS

| 6,440,612 | B1 | 8/2002 | Baggenstoss | |
|---|---|---|---|---|
| 2003/0035090 | A1* | 2/2003 | Imai et al. | ...................... 355/53 |
| 2008/0128642 | A1 | 6/2008 | Mos et al. | |
| 2008/0130982 | A1* | 6/2008 | Kitamura et al. | ............ 382/144 |

OTHER PUBLICATIONS

International Search Report and Written Opinion for Application No. PCT/NL2007/000298 mailed Jul. 4, 2008, 13 pgs.

Omori et al., "Progress in Proximity Electron Lithography: Demonstration of Print and Overlay Performance Using the Low-Energy Electron Beam Proximity-Projection Lithography [beta] tool", Journal of Microlithography, Microfabrication, and Microsystems, SPIE-Int. Soc. Opt. Eng USA, vol. 3, No. 3, Jul. 2004, pp. 402-412.

Seong-Yong Moon et al., "Analysis of photomask distortion caused by blank materials and open ratios", to appear in the Proceedings of the 20$^{th}$ Annual BACUS Symposium on Photomask Technology and Management, SPIE vol. 4186.

* cited by examiner

Primary Examiner—Jack I Berman
(74) Attorney, Agent, or Firm—Sterne, Kessler, Goldstein & Fox P.L.L.C (57) ABSTRACT

A lithographic apparatus includes an illumination system configured to condition a radiation beam, a support for a patterning device, a substrate table for a substrate, a projection system, and a control system. The patterning device is capable of imparting the radiation beam with a pattern in its cross-section to form a patterned radiation beam. The projection system is configured to project the patterned radiation beam as an image onto a target portion of the substrate along a scan path. The scan path is defined by a trajectory in a scanning direction of an exposure field of the lithographic apparatus. The control system is coupled to the support, the substrate table and the projection system for controlling an action of the support, the substrate table and the projection system, respectively. The control system is configured to correct a local distortion of the image in a region along the scan path by a temporal adjustment of the image in that region.

21 Claims, 5 Drawing Sheets

LITHOGRAPHIC APPARATUS AND DEVICE MANUFACTURING METHOD

FIELD OF THE INVENTION

The present invention relates to a lithographic apparatus and a method for manufacturing a device. Also, the present invention relates to a computer program.

BACKGROUND OF THE INVENTION

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A mask is typically fabricated by electron beam lithography, in which a desired mask pattern is created on a photosensitive layer on the mask by means of controlled exposure of that layer to the electron beam (e-beam writing process). The pattern in the photosensitive layer is then transferred in a mask pattern layer which is typically a metal layer arranged on a transparent mask base layer.

It is known that due to the lithographic process the created mask pattern layer may exhibit some distortions or defects. Typical causes of defects are, for example, stress induced distortion (of the mask pattern layer), heating induced distortion during the e-beam writing process or distortions caused by a pellicle that is placed over the mask.

During a transfer of the mask pattern to the target portion, the distortions will be transferred along with the mask pattern into the pattern created on the target portion. Since the creation of the IC involves the creation of a number of patterns overlaying each other in the target portion, the distortions of each mask pattern contribute to overlay errors within the target portion. Such overlay errors are often referred to as intra-field overlay errors.

BRIEF SUMMARY OF THE INVENTION

It is desirable to have a system and method which are capable of reducing or correcting the contribution of mask pattern distortions or defects to distortions of exposed patterns.

According to an aspect of the invention, there is provided a lithographic apparatus comprising:
an illumination system configured to condition a radiation beam;
a support structure constructed to support a patterning device, the patterning device being capable of imparting the radiation beam with a mask pattern in a cross-section of the radiation beam to form a patterned radiation beam;
a substrate table constructed to hold a substrate;
a projection system configured to project the patterned radiation beam as a pattern image onto a target portion of the substrate along a scan path, the scan path being defined by a trajectory in a scanning direction of an exposure field of the lithographic apparatus; and
a control system configured to correct a local distortion of the pattern image in a region along the scan path by effecting a temporal adjustment of the pattern image in said region.

According to an aspect of the invention, there is provided a lithographic apparatus as described above, wherein the control system is further configured to correct an overall orientation of the patterned radiation beam in comparison with a second overall orientation of a patterned structure in the target portion to minimize an overall overlay error between the patterned radiation beam and the patterned structure in the target portion, and wherein the control system is further configured to provide a local distortion of the pattern image in a region along the scan path that relates to a local overlay error in that region along the scan path.

According to an aspect of the invention, there is provided a device manufacturing method comprising: projecting a patterned radiation beam as a pattern image onto a target portion of a substrate along a scan path, the scan path being defined by a trajectory in a scanning direction of an exposure field; and correcting a local distortion of the pattern image in a region along the scan path by effecting a temporal adjustment of the pattern image in that region.

According to an aspect of the invention, there is provided a computer program stored on a machine-readable medium. The computer program includes instructions for exercising control over a lithographic apparatus so as to perform a method comprising: projecting a patterned radiation beam as a pattern image onto a target portion of a substrate along a scan path, the scan path being defined by a trajectory in a scanning direction of an exposure field; and correcting a local distortion of the pattern image in a region along the scan path by effecting a temporal adjustment of the pattern image in that region.

According to an aspect of the invention, there is provided a computer program as described above, wherein the machine-readable medium is a memory device connected to a processor associated with the lithographic apparatus. The processor can be adapted to execute the aforementioned instructions and control the lithographic apparatus in accordance with those instructions. The processor also can be connected at least indirectly to: a support structure of the lithographic apparatus (which is adapted to support a patterning device capable of imparting a pattern on a radiation beam to achieve the patterned radiation beam); a substrate table of the lithographic apparatus (which is constructed to hold the substrate); and a projection system of the lithographic apparatus (which is configured to project the patterned radiation beam as the pattern image). The processor also can be configured to exercise control over the support structure, the substrate table, and/or the projection system so as to perform the aforementioned method.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
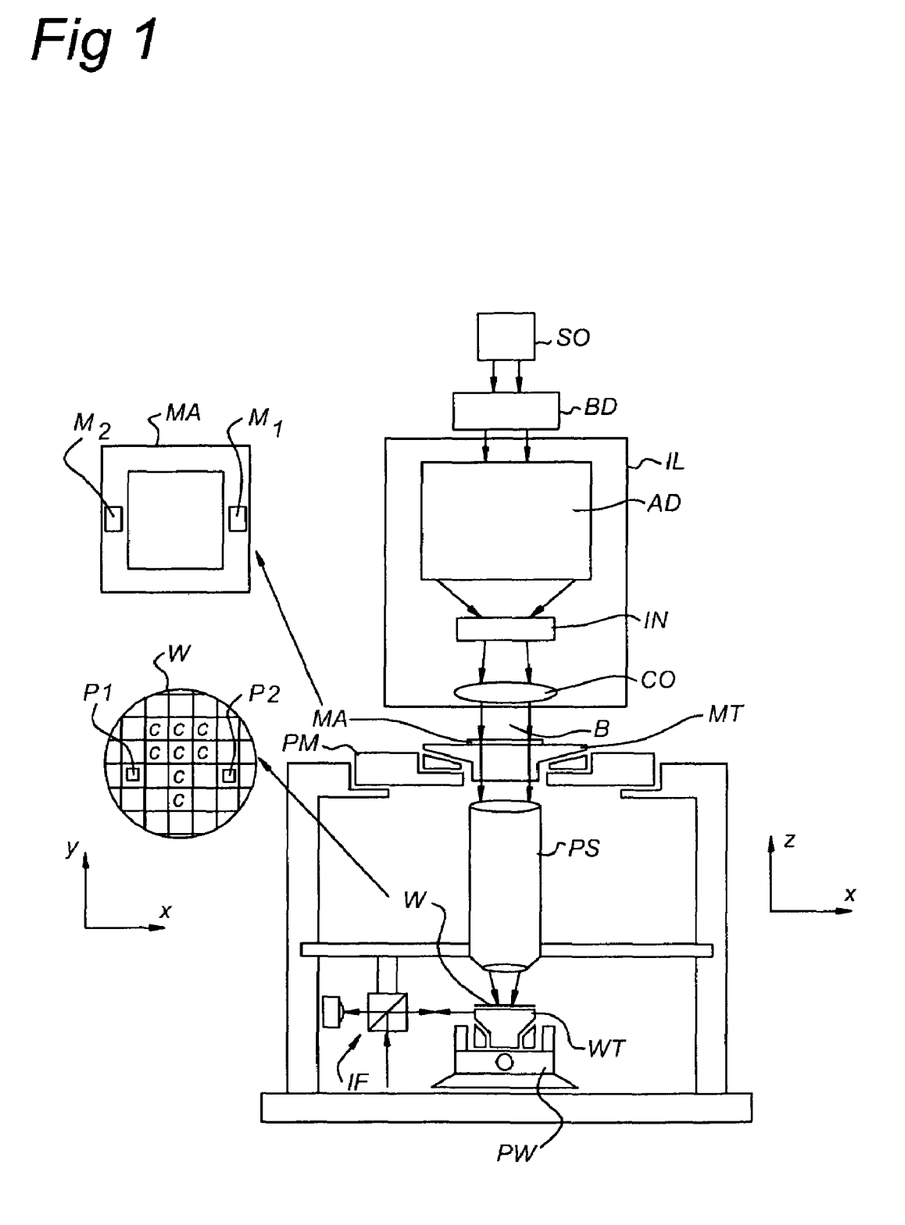
FIG. 1 depicts a lithographic apparatus according to an embodiment of the invention.

FIG. 1 schematically depicts a lithographic apparatus according to one exemplary embodiment of the invention. The apparatus comprises:
- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field (or scan field) limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
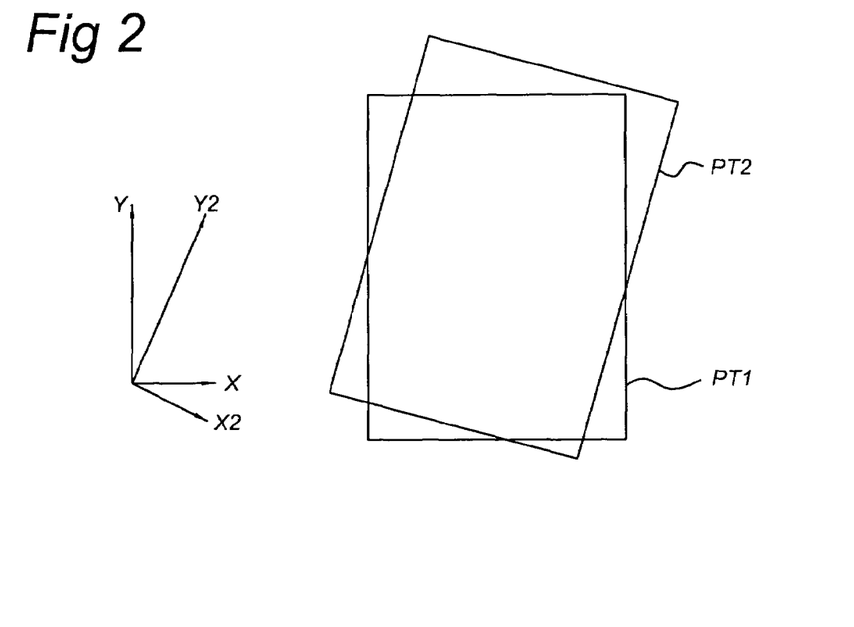
FIG. 2 depicts an overlay of a first mask pattern and a second mask pattern on a target portion.

FIG. 2 depicts an overlay of a first pattern PT1 and a second pattern PT2 on a target portion.

The first pattern PT1 and second pattern PT2 on a target portion (for example, a semiconductor substrate) have been created by well-known lithographic procedures comprising:

application of a photosensitive layer on the substrate, exposing the photosensitive layer to radiation which has been patterned by means of the first mask pattern to create an image of the first mask pattern in the photosensitive layer, transfer of the image of the first mask pattern into the surface of the semiconductor substrate to create the first pattern PT1, providing a layer covering the first pattern PT1, application of a second photosensitive layer on the covering layer, aligning the wafer with respect to the second mask in order to obtain alignment of the second pattern PT2 with the second mask pattern to be patterned in the covering layer, exposing the second photosensitive layer to radiation which has been patterned by means of the second mask pattern to create an image of the second mask pattern in the second photosensitive layer, transfer of the image of the second mask pattern into the covering layer to create the second pattern PT2.

The first and second patterns PT1, PT2 are illustrated by an outline of their respective scan field, which is associated with an image of the respective pattern projected along a trajectory parallel to the scanning direction, i.e. the scan path.

The first pattern PT1 is obtained during a scan along scanning direction Y, while the second pattern is obtained during a scan along second scanning direction Y2, which in this example does not coincide with scanning direction Y of the first pattern.

It should be noticed that in the present invention, at least the exposure of the second photosensitive layer is done by means of a scanner lithographic apparatus. The exposure of the first photosensitive layer may be done by a scanner (not necessarily the same as the scanner performing the exposure of the second photosensitive layer) but alternatively the exposure of the first photosensitive layer may have been done by a stepper lithographic apparatus.

Due to misalignment of the first and second patterns PT1, PT2, the overlay of the second pattern PT2 on the first pattern PT1 will have some error as shown schematically by the misfit between the two outlines.

To reduce misalignment and to improve overlay accuracy, correction methods are known. In one method, misalignment is corrected by the so-called 6-parameter overlay correction model which provides the minimal number of parameters for alignment. An overall overlay error correction can be made by one or more of the following correction parameters: translation in the X-direction, translation in the Y-direction, (scan) field rotation, field scaling, field asymmetric rotation and field asymmetric scaling, the latter four correction parameters with respect to both the X-direction and the Y-direction.

In this respect, the scanning direction as described above is considered as the Y-direction.

The 6-parameter overlay correction model is capable of correcting overlay error by basically predetermined adaptation of the scanner movements during the scan of the second mask pattern.

Notably, the overlay correction relates to an overall correction to improve the coincidence of the scan fields of the first and second patterns PT1,PT2.

Figure 3:
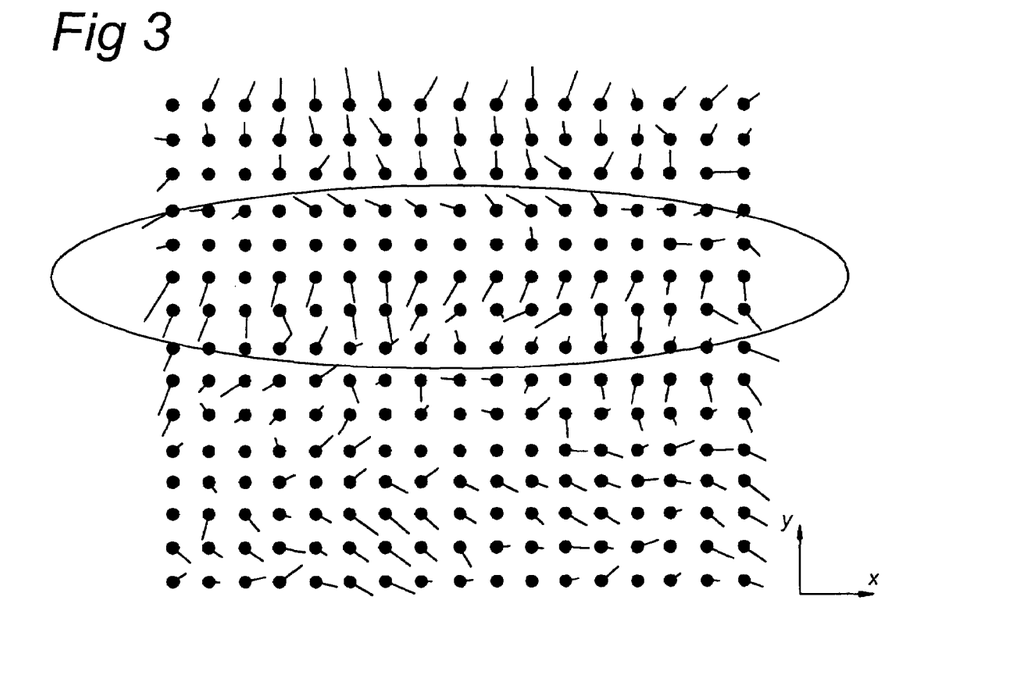
FIG. 3 depicts an example of residual mask pattern distortion.

A mask-related distortion within the pattern(s), as explained above, will not be corrected, because such mask-related distortion with a scan field is typically non-linear and the overlay correction methods from the prior art assume that the pattern does not have any internal deformation FIG. 3 depicts an example of a residual overlay error map of an overlay of the first and second patterns PT1, PT2 after overall corrections for translation, rotation and scaling. Within the overlay error map, local overlay errors are shown. The local overlay errors relate to residual overlay errors after overall correction by the correction model, in this case the 6-parameter overlay correction model.

The local overlay errors are depicted as vector-lines of which the length relates to the magnitude of the overlay error and of which the direction relates to the direction of the overlay error.

Within the elliptical area, a relatively abrupt change of the local overlay error is visible.

The present invention provides a system and method that, for a given local residual overlay error due to mask distortion, allow an intra-field correction during the scan of the second pattern PT2, which intra-field correction is superimposed as a dynamic (temporal) correction on any overall correction provided by the 6-parameter overlay correction model.

The intra-field correction comprises a first set of corrections which relate to dynamic/temporal adjustments of projection system parameters (or lens parameters), and a second set of corrections which relate to dynamic/temporal adjustments of scan parameters during the scan of the second pattern PT2. The dynamic adjustments of the scan parameters are superimposed on the overall scan parameters set in accordance with the 6-parameter overlay correction model to provide an overall correction of the scan of the second pattern PT2 relative to the first pattern PT1.

Alternatively, the dynamic adjustments of the scan parameters may be superimposed on the correction set in accordance with the polynomial overlay correction model to provide an overall correction of the scan of the second pattern PT2 relative to the first pattern PT1.

Figure 4A:
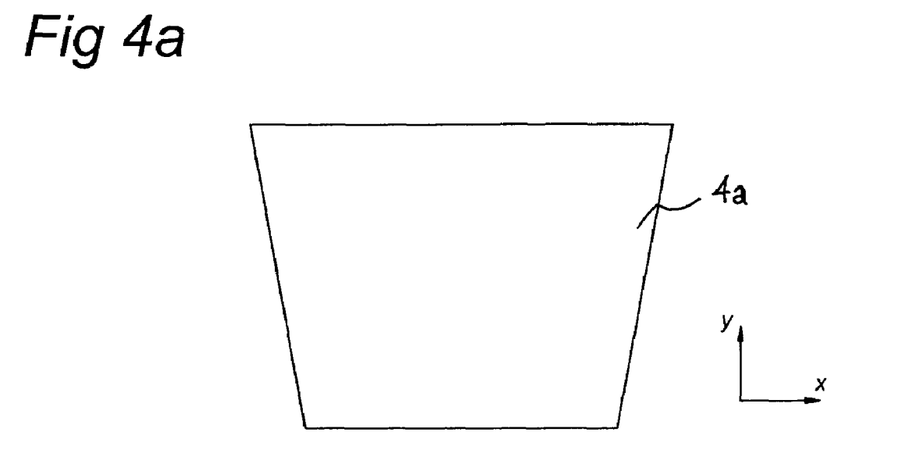
FIGS. 4a, 4b, 4c depict a first set of corrections for mask pattern distortion-related intra-field overlay error.
Figure 4B:
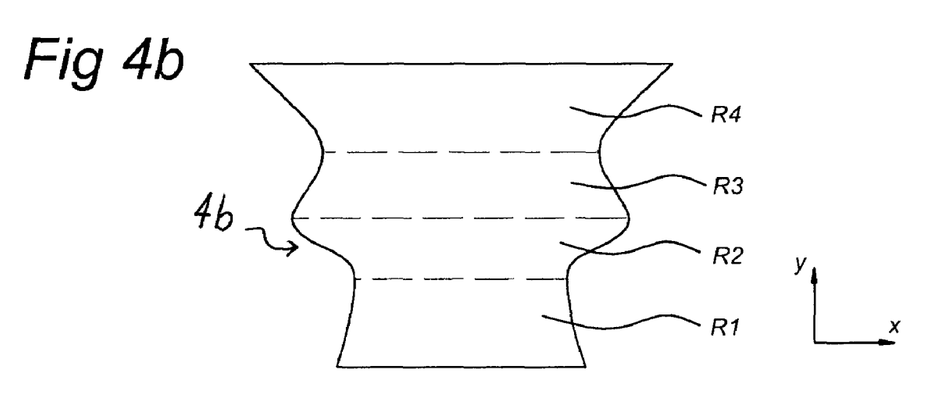
Figure 4C:
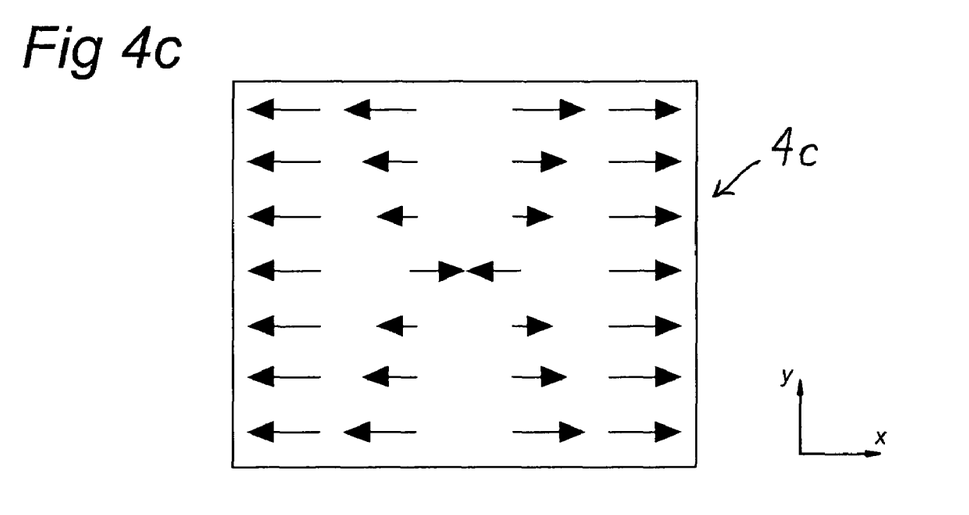

FIGS. 4a, 4b, 4c depict a first set of corrections for mask pattern distortion-related intra-field overlay error. Lens parameters can be used to adjust the lens magnification and third order lens aberrations. Possibly other lens aberrations are also adjustable for use as correction, but this may depend on the design of the projection lens system and the availability of suitable actuators for actuating the lens to correct such other lens aberration. While a scan is performed, the lens magnification can be varied along a scan path in the Y direction, i.e. a trajectory that is traversed during the exposure scan.

A first type of lens parameter correction according to the present invention, is a linear variation of the lens magnification in the X-direction (which is perpendicular to the scanning direction Y).

The first type is schematically depicted in FIG. 4a as trapezoid area 4a, which is related to the scan field and its local magnification.

At the lower region of the scan field (for example, the begin of the scan), the magnification in the X-direction is relatively small. At the upper region of the scan field, the magnification is different, in this example relatively larger. By the first type of lens parameter correction, the magnification of the pattern (in the X-direction) varies linearly during the scan.

A second type of lens parameter correction according to the present invention, is a non-linear variation of the magnification in the X-direction. The second type is schematically depicted in FIG. 4b as a variable area 4b.

An example of a non-linear variation is illustrated in FIG. 4b. At a lower region R1 of the variable area 4b, the lens magnification in the X direction reduces during the scan (illustrated by a first convergence of the left and right boundaries of the area 4b). At a next region R2, the lens magnification in the X direction increases (illustrated by a first divergence of the left and right boundaries of the area 4b). At a further region R3, the lens magnification in the X direction reduces again (illustrated by a second convergence of the left and right boundaries of the area 4b). Finally, in a still further region R4, the lens magnification in the X direction increases again (illustrated by a second divergence of the left and right boundaries of the area 4b).

A third type of lens parameter correction according to the present invention, is a variation of the third order lens aberration correction in the X-direction. The third type is schematically depicted in FIG. 4c as a scan field area 4c.

The lens magnification in the X-direction is constant, which results in a rectangular scan field. Within the scan field, the third order lens aberration correction can be varied along the Y-direction. This variation is illustrated by means of arrows directed in the X-direction. The length of the arrows varies as a function of the position in the Y-direction to illustrate the variation of the third order lens aberration in the Y-direction.

By varying the magnification in the X-direction or the third order lens aberration correction from one region in the scan field to another, a dimension (parallel to the X-direction) of a feature of a pattern within the one region can be adjusted relative to another feature of the pattern in the other region.

It should be noted that FIGS. 4a, 4b, and 4c illustrate examples of variations of lens parameters. Variation of lens parameters according to the present invention is not limited to these examples.

Figure 5A:
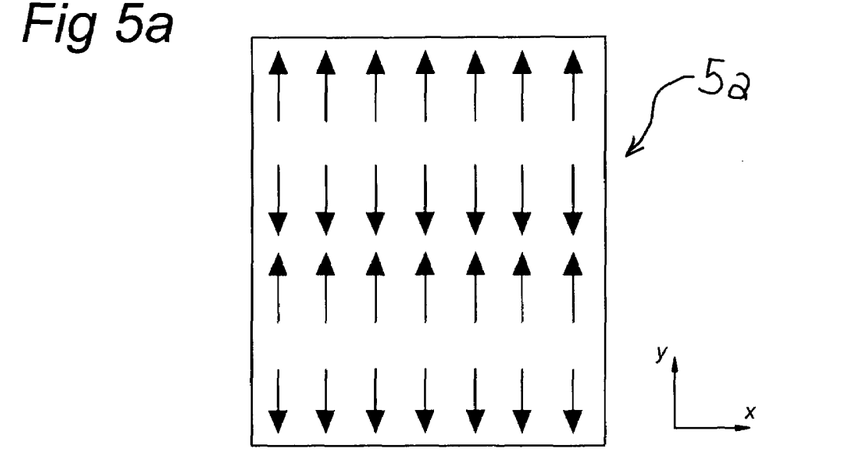
FIGS. 5a, 5b, 5c depict a second set of corrections for mask pattern distortion-related intra-field overlay error.
Figure 5B:
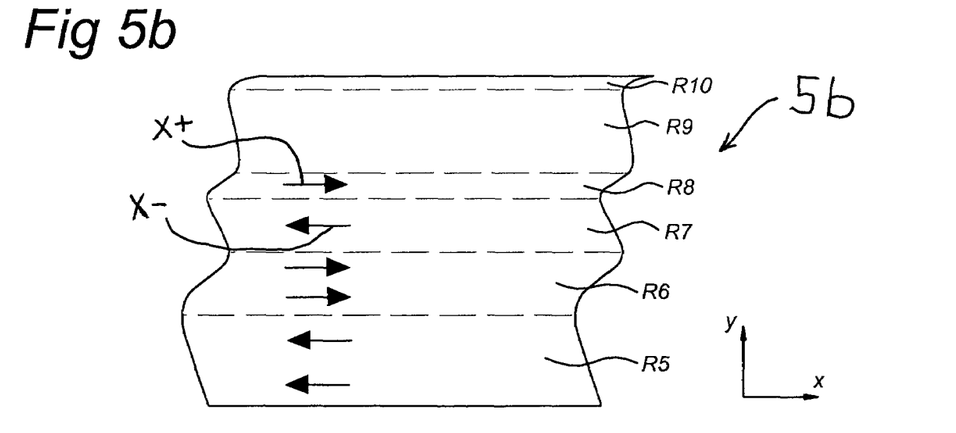
Figure 5C:
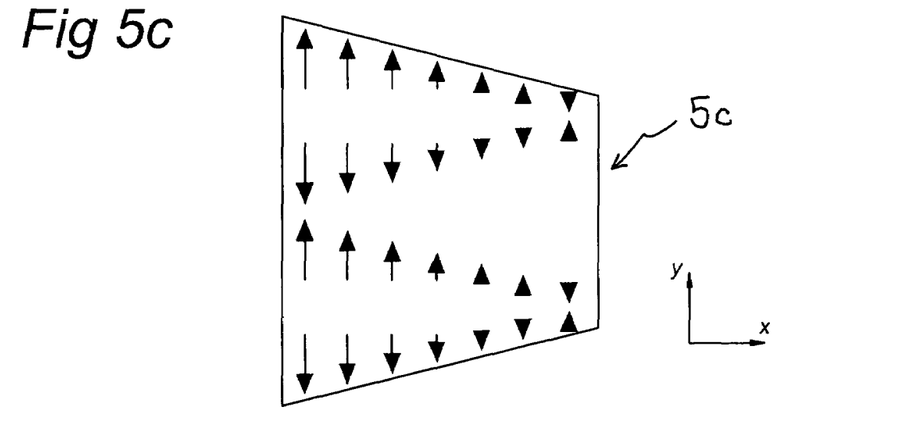

FIGS. 5a, 5b, and 5c depict a second set of corrections for mask pattern distortion-related intra-field overlay error.

The second set of corrections relates to dynamic adjustments of scan parameters superimposed on the overall scan parameters set in accordance with the 6-parameter overlay correction model to provide an overall correction of the scan of the second pattern PT2 relative to the first pattern PT1.

By using these dynamic adjustments of scan parameters, a variation of the magnification of the pattern in the Y-direction, a variation of translation and a variation of rotation can be achieved as explained below.

FIG. 5a depicts a scan field 5a in which a variation of the magnification in the Y-direction is implemented by a variation of a scan speed between the mask stage and the wafer stage in the Y-direction. Within the scan field 5a, arrows are shown which indicate regions having a deceleration (regions with arrows pointing downward) or an acceleration (regions with arrows pointing upward) of the scan speed. By varying the scan speed between the mask stage and the wafer stage from one region in the scan field to another, a dimension (parallel to the Y-direction) of a feature of a pattern within the one region can be adjusted relative to another feature of the pattern in the other region.

FIG. 5b depicts a scan field 5b in which a variation of the translation in the X-direction is implemented as a function of the scan path.

The translation in the X-direction can be varied along the X-direction in one direction (indicated by arrow X+) or the opposite direction (indicated by arrow X−). The translation directions are shown within the scan field.

In the example shown in FIG. 5b, in a lower region R5 translation is carried out in the direction X−. In a next region R6, translation in the other direction X+ is performed. In a further region R7, translation is carried out again in the direction X−. In subsequent region R8, translations are again directed in the direction X+. In a next region R9, translations are substantially zero. In a final region R10, a translation is carried out in the direction X+.

By varying the translation from one region in the scan field to another, a position of a feature of a pattern within the one region can be adjusted relative to a position of another feature of the pattern in the other region.

FIG. 5c depicts a scan field 5c in which a variation of the rotation is implemented as a function of the scan path.

Within the scan field 5c, arrows are shown which indicate regions having a sense of rotation in one direction (regions with arrows pointing downward) or an opposite sense of rotation (regions with arrows pointing upward). The length of the arrows in a region indicates a distance of the arrow from a center of rotation in that region.

By varying the sense of rotation from one region in the scan field to another, an orientation of a feature of a pattern within the one region can be adjusted relative to an orientation of another feature of the pattern in the other region.

The dynamic adjustments of lens parameters and scan parameters according to the method of the present invention while executing a scan as illustrated above, are determined from a residual mask distortion for the overlay of a first pattern PT1 and second pattern PT2. The residual local distortion of the mask may be derived from measurement of an overlay pattern created on a semiconductor substrate, but additionally or alternatively from distortion measurements on the first and/or second mask pattern. The procedures for determining residual local distortion are known to the skilled person.

Corrections by the known 6-parameter overlay correction model can be taken into account when determining the residual local mask distortion.

After determination of the residual local distortion, which can be represented by a residual distortion map, the required adjustments of lens parameters and scan parameters according to the present invention can be determined. Due to the projection characteristics of a scan (i.e. projecting a series of line-shaped patterns parallel to the X-direction in a sequence along the scan path in the Y-direction), the dynamic adjustments are determined so as to minimize the residual distortions in both the X-direction and the Y-direction for each point along the scan path in the Y-direction.

It is noted that in case the local distortion is determined from distortion measurement on a distorted mask pattern, it is in principle conceivable to correct a pattern image during exposure (i.e., the pattern produced in a photosensitive layer by exposure of that layer by a radiation beam which is patterned by the distorted mask pattern) per se, without a further overall overlay correction by e.g. the 6-parameter overlay correction model. An exposure of a single pattern thus may also be corrected by the dynamic adjustments of lens parameters and scan parameters according to the present invention.

The adjustments of lens parameters and scan parameters as required to minimize the residual distortions can be any combination of the adjustments of one or more lens parameters and one or more scan parameters as described with reference to FIGS. 4a-4c and 5a-5c.

An exemplary method according to the present invention comprises:
  creating a pattern image on a substrate;
  determining residual distortions of the pattern image in a residual distortion map;
  determining for each point along the scan path in the Y-direction a minimization of the residual distortions in the X-direction and the Y-direction, wherein the minimization is effectuated by an adjustment of at least one from a group comprising a first set of at least one lens parameter and a second set of at least one scan parameter;
  during a scan for providing exposure of the second pattern, for each point along the scan path, the determined minimization of the residual distortions is achieved in the X-direction and the Y-direction by carrying out the adjustment of at least one lens parameter and/or at least one scan parameter.

In one embodiment, the pattern image relates to the pattern image of a single mask pattern. In another embodiment, the pattern image relates to an overlay between the first pattern and the second pattern.

Figure 6:
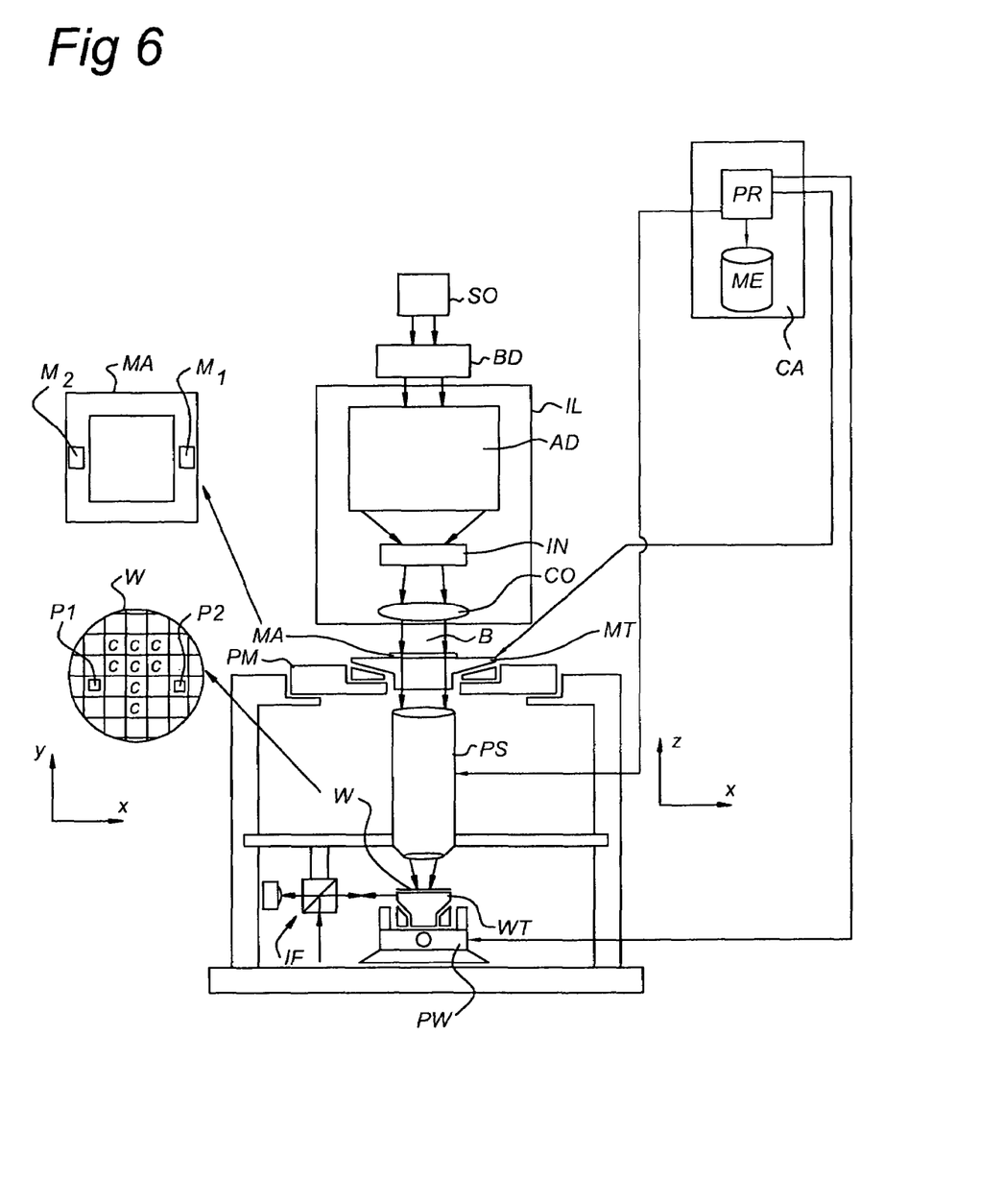
FIG. 6 depicts a lithographic apparatus comprising a computer system arranged for performing a method in accordance with the present invention.

FIG. 6 depicts a lithographic apparatus comprising a computer system CA arranged for performing a method in accordance with the present invention.

In FIG. 6, entities with the same reference number as shown in the preceding figures refer to the corresponding entities in the preceding figures.

To control adjustments of lens parameters and scan parameters during scanning, a lithographic apparatus is equipped with a control system that is capable of controlling the required adjustments for each point along the scan path.

Typically, such a control system includes a computer system CA comprising a processor PR for performing arithmetical operations, and a memory ME. This is schematically depicted in FIG. 6, showing an example of a lithographic apparatus, similar to the lithographic apparatus as shown in FIG. 1, now further comprising the processor PR which is arranged to communicate with memory ME or some other form of machine-readable medium or media. Memory ME may be any type of memory arranged to store instructions and data, such as a tape unit, a hard disk, Read Only Memory (ROM), Non-Volatile Random Access Memory (NVRAM) and Random Access Memory (RAM).

The processor PR may be arranged to read and execute one or more programs stored in memory ME providing the processor PR with the functionality to perform the method for adjustments described above. In order to be able to perform these methods, the processor PR is arranged to determine and control a position of the mask table MT, a position of the substrate table WT, and/or parameters of the projecting system PS (lens system), and possibly further components of the lithographic apparatus. The processor PR may be specially equipped or configured to perform the described embodiment of the method, but may also be a central processor arranged to control the lithographic apparatus as a whole and now being provided with additional functionality to perform the described implementation or embodiment of the method, or other implementations of the method.

It should be understood that there may be provided more and/or other units, such as memory units, input devices and read devices known to persons skilled in the art. Moreover, one or more of them may be physically located remotely from the processor PR, if required. The processor PR is shown as one box, however, it may comprise several processing units functioning in parallel or controlled by one main processor PR that may be located remotely from one another, as is known to persons skilled in the art.

It is observed that, although all connections in FIG. 6 are shown as physical connections, one or more of these connections can be made wireless. They are only intended to show that "connected" units are arranged to communicate with one another in some way. The computer system can be any signal processing system with analog and/or digital and/or software technology arranged to perform the functions discussed here.

The computer system can also be configured to determine residual distortions of an overlay between the first pattern PT1 and the second pattern PT2 in a residual distortion map.

The overlay data relating to the overlay between the first pattern PT1 and the second pattern PT2 may be obtained from a metrology tool that measures the intra-field local overlay of the first and second patterns PT1,PT2. Alternatively, the overlay data may be obtained from distortion measurements of the first and second mask patterns.

The computer system can also be configured to determine, for each point along the scan path in the Y-direction, a minimization of the residual distortions in the X-direction and the Y-direction, wherein the minimization is effectuated by an adjustment of at least one lens parameter and/or at least one scan parameter.

Furthermore, the computer system can be configured to provide during exposure of the second pattern in a scan, for each point along the scan path, the determined minimization of the residual distortions in the X-direction and the Y-direction by carrying out the adjustment of at least one lens parameter and/or at least one scan parameter.

The dynamic adjustments during the scan relating to the lens parameters can be effectuated by controlling the settings of the projecting system PS. The dynamic adjustments during the scan relating to the scan parameters, alternatively or additionally, can be effectuated by controlling the position of the mask table MT and/or the position of the substrate table WT. The adjustments of the lens parameters and the scan parameters are controlled by the computer system for each point along the scan path in the Y-direction.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
    a support structure configured to support a patterning device, the patterning device being capable of imparting a radiation beam with a mask pattern in a cross-section of the radiation beam to form a patterned radiation beam;
    a substrate table configured to hold a substrate;
    a projection system configured to project the patterned radiation beam as a pattern image onto a target portion of the substrate along a scan path, the scan path being defined by a trajectory in a scanning direction of an exposure field of the lithographic apparatus; and
    a control system configured to correct local overlay errors within the pattern image in the target portion of the substrate along the scan path by dynamic intra-field correction during the scan of the pattern image in said target portion,
    wherein the dynamic intra-field correction provides varying adjustments from one point along the scan path relative to another point along the scan path based on a relative distortion between the two points.

2. The lithographic apparatus of claim 1, wherein the control system is configured so that the dynamic intra-field correction is associated with an adjustment of at least one projection system parameter of the projection system.

3. The lithographic apparatus of claim 2, wherein the at least one projection system parameter is at least one of:
    a projection system magnification parameter, or
    a third order lens aberration correction parameter.

4. The lithographic apparatus of claim 1, wherein the control system is configured so that the dynamic intra-field correction is associated with an adjustment of at least one scan path parameter.

5. The lithographic apparatus of claim 4, wherein the at least one scan path parameter includes at least one of:
    a first scan path parameter relating to a magnification of the patterned radiation beam in the scanning direction,
    a second scan path parameter relating to a translation of the patterned radiation beam in a direction perpendicular to the scanning direction, or a third scan path parameter relating to a rotation of the patterned radiation beam.

6. The lithographic apparatus of claim 1, wherein the control system is further configured to correct an overall orientation of the patterned radiation beam in comparison with a second overall orientation of a patterned structure in the target portion to minimize an overall overlay error between the patterned radiation beam and the patterned structure in the target portion.

7. The lithographic apparatus of claim 1, wherein said control system is:
coupled to one or more of:
the support structure,
the substrate table, or
the projection system; and
adapted to exercise control over operation of said one or more of:
the support structure,
the substrate table, or
the projection system.

8. A device manufacturing method, comprising:
projecting a patterned radiation beam as a pattern image onto a target portion of a substrate along a scan path, the scan path being defined by a trajectory in a scanning direction of an exposure field; and
correcting local overlay errors within the pattern image in the target portion of the substrate along the scan path by dynamic intra-field correction of the pattern image in said target portion,
wherein the dynamic intra-field correction provides varying adjustments from one point along the scan path relative to another point along the scan path based on a relative distortion between the two points.

9. The device manufacturing method of claim 8, wherein the dynamic intra-field correction of the pattern image in said target portion is associated with a first adjustment of at least one projection system parameter of a projection system.

10. The device manufacturing method of claim 9, wherein the at least one projection system parameter is at least one of:
a projection system magnification parameter, or
a third order lens aberration correction parameter.

11. The device manufacturing method of claim 8, wherein the dynamic intra-field correction of the pattern image in said target portion includes adjustment of at least one scan path parameter.

12. The device manufacturing method of claim 11, wherein the at least one scan path parameter includes at least one of:
a first scan path parameter relating to a magnification of the patterned radiation beam in the scanning direction,
a second scan path parameter relating to a translation of the patterned radiation beam in a direction perpendicular to the scanning direction, or
a third scan path parameter relating to a rotation of the patterned radiation beam.

13. The device manufacturing method of claim 8, further comprising:
determining local residual overlay errors of the pattern image in a residual distortion map; and
determining, for each of a plurality of points along the scan path, a minimization of the local residual overlay errors in a direction perpendicular to the scanning direction and parallel to the scanning direction, wherein the minimization is effectuated by the dynamic intra-field correction of the pattern image in said region.

14. A computer program stored on a machine-readable medium, and including instructions for exercising control over a lithographic apparatus so as to perform a method, comprising:

projecting a patterned radiation beam as a pattern image onto a target portion of a substrate along a scan path, the scan path being defined by a trajectory in a scanning direction of an exposure field; and
correcting local overlay errors within the pattern image in the target portion of the substrate along the scan path by dynamic intra-field correction of the pattern image in said target portion,
wherein the dynamic intra-field correction provides varying adjustments from one point along the scan path relative to another point along the scan path based on a relative distortion between the two points.

15. The computer program of claim 14, wherein the machine-readable medium is a memory device connected to a processor associated with the lithographic apparatus, said processor being adapted to execute said instructions and control the lithographic apparatus in accordance with said instructions.

16. The computer program of claim 15, wherein said processor is connected at least indirectly to at least one of:
a support structure of the lithographic apparatus, which is adapted to support a patterning device capable of imparting a pattern on a radiation beam to achieve said patterned radiation beam;
a substrate table of the lithographic apparatus, which is constructed to hold the substrate; or
a projection system of the lithographic apparatus, which is configured to project the patterned radiation beam as said pattern image,
wherein said processor is configured to exercise control over at least one of said support structure, said substrate table, or said projection system so as to perform said method.

17. The computer program of claim 14, wherein the method includes:
determining local residual overlay errors of the pattern image in a residual distortion map; and
determining, for each of a plurality of points along the scan path, a minimization of the local residual overlay errors in a direction perpendicular to the scanning direction and parallel to the scanning direction, wherein the minimization is effectuated by the dynamic intra-field correction of the pattern image in said region.

18. The computer program of claim 14, wherein the dynamic intra-field correction of the pattern image in said target portion is associated with a first adjustment of at least one projection system parameter of a projection system.

19. The computer program of claim 18, wherein the at least one projection system parameter is at least one of:
a projection system magnification parameter, or
a third order lens aberration correction parameter.

20. The computer program of claim 14, wherein the dynamic intra-field correction of the pattern image in said target portion includes adjustment of at least one scan path parameter.

21. The computer program of claim 20, wherein the at least one scan path parameter includes at least one of:
a first scan path parameter relating to a magnification of the patterned radiation beam in the scanning direction,
a second scan path parameter relating to a translation of the patterned radiation beam in a direction perpendicular to the scanning direction, or
a third scan path parameter relating to a rotation of the patterned radiation beam.

* * * * *